US012162364B2

(12) United States Patent
Schwozer

(10) Patent No.: US 12,162,364 B2
(45) Date of Patent: Dec. 10, 2024

(54) VEHICLE COMPRISING A STANDBY POWER SUPPLY DEVICE AND METHOD FOR OPERATING SAME

(71) Applicant: Siemens Mobility GmbH, Munich (DE)

(72) Inventor: Mirko Schwozer, Hoechstadt (DE)

(73) Assignee: Siemens Mobility GmbH, Munich (DE)

( * ) Notice: Subject to any disclaimer, the term of this patent is extended or adjusted under 35 U.S.C. 154(b) by 398 days.

(21) Appl. No.: 17/627,469

(22) PCT Filed: Jun. 19, 2020

(86) PCT No.: PCT/EP2020/067088
§ 371 (c)(1),
(2) Date: Jan. 14, 2022

(87) PCT Pub. No.: WO2021/008810
PCT Pub. Date: Jan. 21, 2021

(65) Prior Publication Data
US 2022/0258611 A1    Aug. 18, 2022

(30) Foreign Application Priority Data

Jul. 18, 2019    (DE) ..................... 10 2019 210 646.3

(51) Int. Cl.
*B60L 9/00*    (2019.01)
*B60L 3/00*    (2019.01)
(Continued)

(52) U.S. Cl.
CPC ............... *B60L 3/0092* (2013.01); *B60L 9/00* (2013.01); *B60L 50/53* (2019.02); *B60L 58/12* (2019.02)

(58) Field of Classification Search
CPC .......... B60L 3/0092; B60L 9/00; B60L 50/53; B60L 58/12; B60L 1/00; G01R 31/006
See application file for complete search history.

(56) References Cited

U.S. PATENT DOCUMENTS

| 2013/0154543 A1* | 6/2013 | Richardson ........... H02J 7/0034 320/109 |
| 2015/0115703 A1* | 4/2015 | Hatanaka ................. B60L 7/26 307/9.1 |

(Continued)

FOREIGN PATENT DOCUMENTS

| DE | 102013203843 A1 | 9/2014 |
| DE | 102014224922 A1 | 6/2016 |

(Continued)

OTHER PUBLICATIONS

DE102017213306 A machine translation (Year: 2019).*

*Primary Examiner* — Anne Marie Antonucci
*Assistant Examiner* — Jingli Wang
(74) *Attorney, Agent, or Firm* — Laurence A. Greenberg; Werner H. Stemer; Ralph E. Locher

(57) ABSTRACT

A vehicle includes a converter with a connection on the input side for a vehicle-integrated or vehicle-external supply network and which can generate a DC voltage on the output side; and an internal DC network which can be operated using the DC voltage of the converter. A standby power supply device is connected between the converter and the internal DC network. The input voltage of the standby power supply device is formed directly or indirectly by the DC voltage of the converter and the standby power supply device feeds its input voltage or alternatively an auxiliary operating voltage supplied by a stored energy source into the internal DC network as output voltage. The vehicle has a monitoring device which is configured to process at least three control signals.

18 Claims, 6 Drawing Sheets

(51) Int. Cl.
    *B60L 50/53*    (2019.01)
    *B60L 58/12*    (2019.01)

(56) References Cited

U.S. PATENT DOCUMENTS

2020/0386826 A1* 12/2020 Chiu ................. G01R 19/0069
2021/0173014 A1*  6/2021 Stoeger ............... H05B 45/375

FOREIGN PATENT DOCUMENTS

| | | | |
|---|---|---|---|
| DE | 102016221249 A1 | | 5/2018 |
| DE | 102017213306 A1 | * | 2/2019 ................ B60L 1/00 |
| EP | 2832579 A1 | | 2/2015 |
| JP | 2002369308 A | | 12/2002 |

\* cited by examiner

VEHICLE COMPRISING A STANDBY POWER SUPPLY DEVICE AND METHOD FOR OPERATING SAME

FIELD AND BACKGROUND OF THE INVENTION

The invention relates to vehicles and to methods for operating electrical assemblies in vehicles.

In the field of rail vehicle technology and in the railroad field, rail vehicles are known that are fitted with a converter which has a connection on the input side for a vehicle-integrated or vehicle-external supply network and can generate a DC voltage on the output side, and an internal DC network which can be operated using the DC voltage of the converter.

SUMMARY OF THE INVENTION

The object of the invention is to specify a vehicle which guarantees particularly reliable operation in view of the risk of a failure in the supply of current or voltage.

This object is inventively achieved by a vehicle as claimed. Advantageous embodiments of the inventive vehicle are specified in the dependent claims.

Accordingly it is inventively provided that a standby power supply device is connected between the converter and the internal DC network, the input voltage of the standby power supply device is formed directly or indirectly by the DC voltage of the converter and the standby power supply device feeds its input voltage or alternatively an auxiliary operating voltage supplied by a stored energy source of the standby power supply device into the internal DC network as output voltage, and the vehicle has a monitoring device which is designed to process at least three control signals, namely a first control signal which describes the DC voltage output by the converter, a second control signal which describes the output voltage fed by the standby power supply device into the DC network, and a third control signal which describes the state of charge of the stored energy source and forms a state of charge signal, and as a function of the three control signals generates at least one state signal which specifies a state of the electrical assembly comprising the converter and the standby power supply device.

A major advantage of the inventive vehicle is that the standby power supply device is inventively connected between the converter and the internal DC network, such that the DC voltage of the converter and the output voltage fed into the DC network can be metrologically detected independently of one another. This measure in turn enables the inventively provided monitoring device to generate, on the basis of at least three control signals, a state signal describing the respective state of converter and standby power supply device, as a result of which any failure of components can be detected particularly reliably and safety measures to safeguard the driving of the vehicle can be rapidly taken. If the monitoring device establishes a critical state and it generates a corresponding state signal, an emergency action, for example the braking of the vehicle, can be triggered by a higher-level vehicle assistance device or an on-board control device, so long as sufficient energy is still available for the performance of this emergency step.

The converter is preferably implemented with reliable isolation and prevents impermissible overvoltages or faults being carried over into the safety-loaded internal DC network.

The converter is preferably also nonreactive and prevents energy being fed back from the standby power supply device into the higher-level supply network.

It is regarded as advantageous if the monitoring device is designed such that it generates an error signal indicating an error in a control unit of the standby power supply device if the first control signal lies within a tolerance range predefined for the first control signal and the second control signal lies outside a tolerance range predefined for the second control signal. The tolerance range predefined for the first and/or second control signal can for example correspond to the rated voltage/target voltage of the internal DC network with a tolerance of ±10%.

As a state signal the monitoring device preferably generates an error signal indicating an error in the stored energy source of the standby power supply device if the third control signal indicates a state of charge that lies outside a tolerance range predefined for the state of charge of the stored energy source. The tolerance range predefined for the third control signal can for example be 50% to 100% of the rated charge/maximum charge of the stored energy source.

As a state signal the monitoring device preferably generates an error signal indicating an error in the converter or the supply network if the first control signal lies outside a tolerance range predefined for the first control signal.

The monitoring device is preferably designed to carry out a test operation, in which it switches off the input-side supply to the standby power supply device, in other words the input voltage present at the standby power supply device, in particular by switching off the converter or by switching off the external supply to the converter by the supply network, and after the switch-off evaluates the chronological sequence of the three control signals.

In the case of the latter embodiment variant it is advantageous if the monitoring device generates a test signal indicating the correct state of the standby power supply device if after the input-side voltage of the standby power supply device is switched off the second and third control signal remain within their tolerance ranges for a predefined minimum period of time.

The monitoring device is preferably designed to carry out the test operation at regular or irregular intervals autonomously or in response to an external control command.

The supply network is preferably a DC voltage network, in particular a DC voltage on-board network of the vehicle, and the converter is preferably a DC/DC converter which is fed by the DC voltage network.

A control device is preferably connected to the internal DC network fed by the standby power supply device, and receives the three control signals (from measuring devices preferably working independently of one another) and forwards them in processed or unprocessed form to the monitoring device.

The control device, the monitoring device and the connection path between the control device and the monitoring device preferably meet a predefined safety standard.

The predefined safety standard is preferably SAS1/SIL1 or better than these (e.g. SAS4/SIL4).

The standby power supply device, in particular the control unit thereof, preferably works without any time lag or at least with such a small time lag that it can be regarded as an uninterruptible power supply device.

The vehicle is preferably an electrically driven rail vehicle.

The invention also relates to a method for operating an electrical assembly of a vehicle, in which a DC voltage is generated on the output side using a converter connected on the input side to a vehicle-integrated or vehicle-external supply network and an internal DC network is operated with the DC voltage of the converter.

It is inventively provided in respect of such a method for a standby power supply device to be connected between the converter and the internal DC network, for the input voltage of the standby power supply device to be formed directly or indirectly by the DC voltage of the converter and for the standby power supply device to feed its input voltage or alternatively an auxiliary operating voltage supplied by the stored energy source into the internal DC network as output voltage, and for a monitoring device to process at least three control signals, namely a first control signal which describes the DC voltage output by the converter, a second control signal which describes the output voltage fed by the standby power supply device into the DC network, and a third control signal which describes the state of charge of the stored energy source and forms a state of charge signal, and as a function of the three control signals generates a state signal which describes a state of the assembly comprising the converter and the standby power supply device.

In respect of the advantages and in respect of advantageous embodiments of the inventive method, reference can be made to the above explanations in connection with the inventive vehicle and the advantageous embodiments of the inventive vehicle.

In the method it is advantageous in particular if
an error signal indicating an error in a control unit of the standby power supply device is generated if the first control signal lies within a tolerance range predefined for the first control signal and the second control signal lies outside a tolerance range predefined for the second control signal, and/or as a state signal an error signal indicating an error in the stored energy source of the standby power supply device is generated if the third control signal lies outside a tolerance range predefined for the third control signal, and/or as a state signal an error signal indicating an error in the converter or in the supply network is generated if the first control signal lies outside a tolerance range predefined for the first control signal.

A test operation is preferably carried out, in which the input-side supply to the standby power supply device, in other words the input voltage present at the standby power supply device, is switched off, in particular by switching off the converter or by switching off the external supply to the converter by the supply network, and after the switch-off the chronological sequence of the three control signals is evaluated.

BRIEF DESCRIPTION OF THE FIGURES

The invention is explained in greater detail below using exemplary embodiments; by way of example

DETAILED DESCRIPTION OF THE INVENTION

Figure 1:
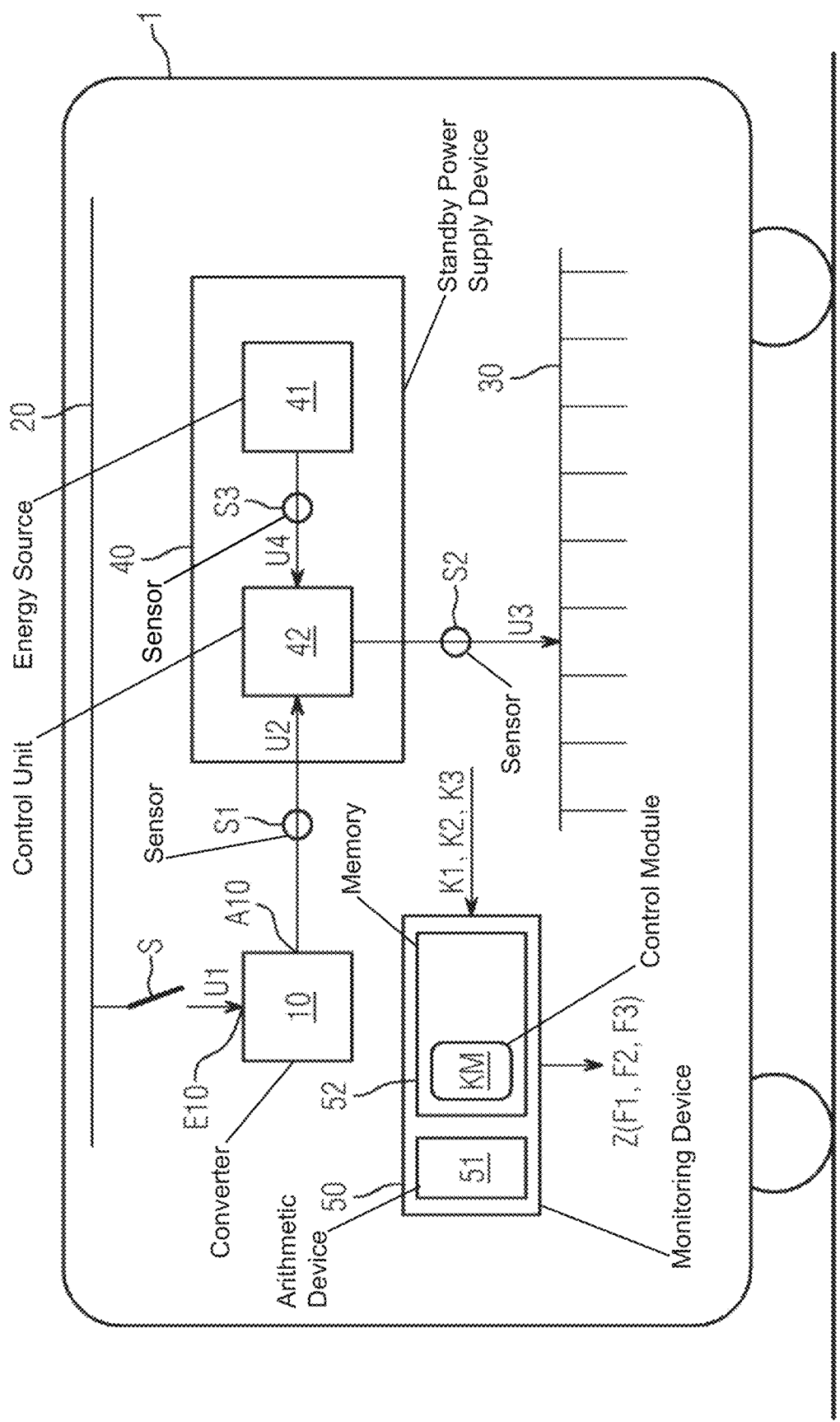
FIG. 1 shows an exemplary embodiment of an inventive vehicle, on the basis of which an exemplary embodiment of a method for operating an electrical assembly present therein is described.

In the figures the same reference characters are always used for identical or comparable components for the sake of clarity.

FIG. 1 shows a vehicle 1, which is preferably an electrically operated or electrically drivable rail vehicle. The vehicle 1 is connected to a converter 10, which on the input side is connected to a vehicle-integrated supply network 20 via a connection E10. The converter 10 generates a DC voltage U2 at an output A10.

If the voltage U1 of the supply network 20 is a DC voltage, a DC/DC converter is used as a converter 10; if the voltage U1 of the supply network 20 is an AC voltage, an AC/DC converter is used as a converter 10.

The converter 10 is connected on the output side to an internal DC network 30 of the vehicle 1. The internal DC network 30 is however not connected to the converter 10 directly, but via a standby power supply device 40. The standby power supply device 40 comprises a stored energy source 41 (e.g. in the form of one or more batteries or capacitors) and a control unit 42 which isolates the converter 10 from the internal DC network 30.

The control unit 42 is designed such that it feeds the DC voltage U2 of the converter 10 as output voltage U3 or line voltage into the internal DC network 30 or alternatively an auxiliary operating voltage U4 supplied by the stored energy source 41.

The control unit 42 is preferably designed such that it feeds the DC voltage U2 of the converter 10 directly into the internal DC network 30 if the DC voltage U2 lies in a predefined voltage range. If the DC voltage U2 exceeds or falls below predefined limits, the control unit 42 will clear the connection between the converter 10 and the internal DC network 30 and alternatively feed the auxiliary operating voltage U4 of the stored energy source 41 into the internal DC network 30, such that the further energy supply of the internal DC network 30 is subsequently effected by the stored energy source 41.

To monitor the converter 10 and the standby power supply device 40, a monitoring device 50 is provided, which is connected to three sensors S1, S2 and S3 via sensor lines not shown in greater detail for reasons of clarity and from these receives three sensor signals in the form of control signals K1, K2 or K3:

A first control signal K1, which the sensor S1 generates, describes the DC voltage U2 output on the output side by the converter 10 and thus the functionality of the converter 10 and the correct supply to the converter 10 by the supply network 20, since the converter 10 can only work correctly if it receives a sufficient supply.

A second control signal K2, which the sensor S2 generates, describes the output voltage U3 fed by the standby power supply device 40 into the internal DC network 30 and thus the functionality of the standby power supply device 40 including the components 41 and 42 contained therein.

A third control signal K3, which the sensor S3 generates, describes the state of charge of the stored energy source 41 and thus the opportunity for the standby power supply device 40 to feed the output voltage U3 into the internal DC network 30 if the converter 10 or the external supply network 20 fails.

The monitoring device 50 has an arithmetic device 51 and a memory 52. Stored in the memory 52 is a control module KM which on execution by the arithmetic device 51 permits or ensures a control operation of the monitoring device 50 which preferably runs as follows:

If the monitoring device 50 or its control module KM establishes that the first control signal K1(U2) lies within a tolerance range predefined for the first control signal K1 and the second control signal K2(U3) lies outside a tolerance range predefined for the second control signal K2, it generates as a state signal Z an error signal F1 indicating an error in the control unit 42 of the standby power supply device 40.

If the monitoring device 50 or its control module KM establishes that the third control signal K3 lies outside a tolerance range which is characteristic of a sufficient state of charge of the stored energy source, it generates as a state signal Z an error signal F2 indicating an error in the stored energy source 41.

If the monitoring device 50 or the control module KM establishes that the first control signal K1(U2) lies outside the tolerance range predefined for the first control signal K1, it generates as a state signal Z on the output side an error signal F3 indicating an error in the converter 10 or an error in the supply network 20.

Figure 2:
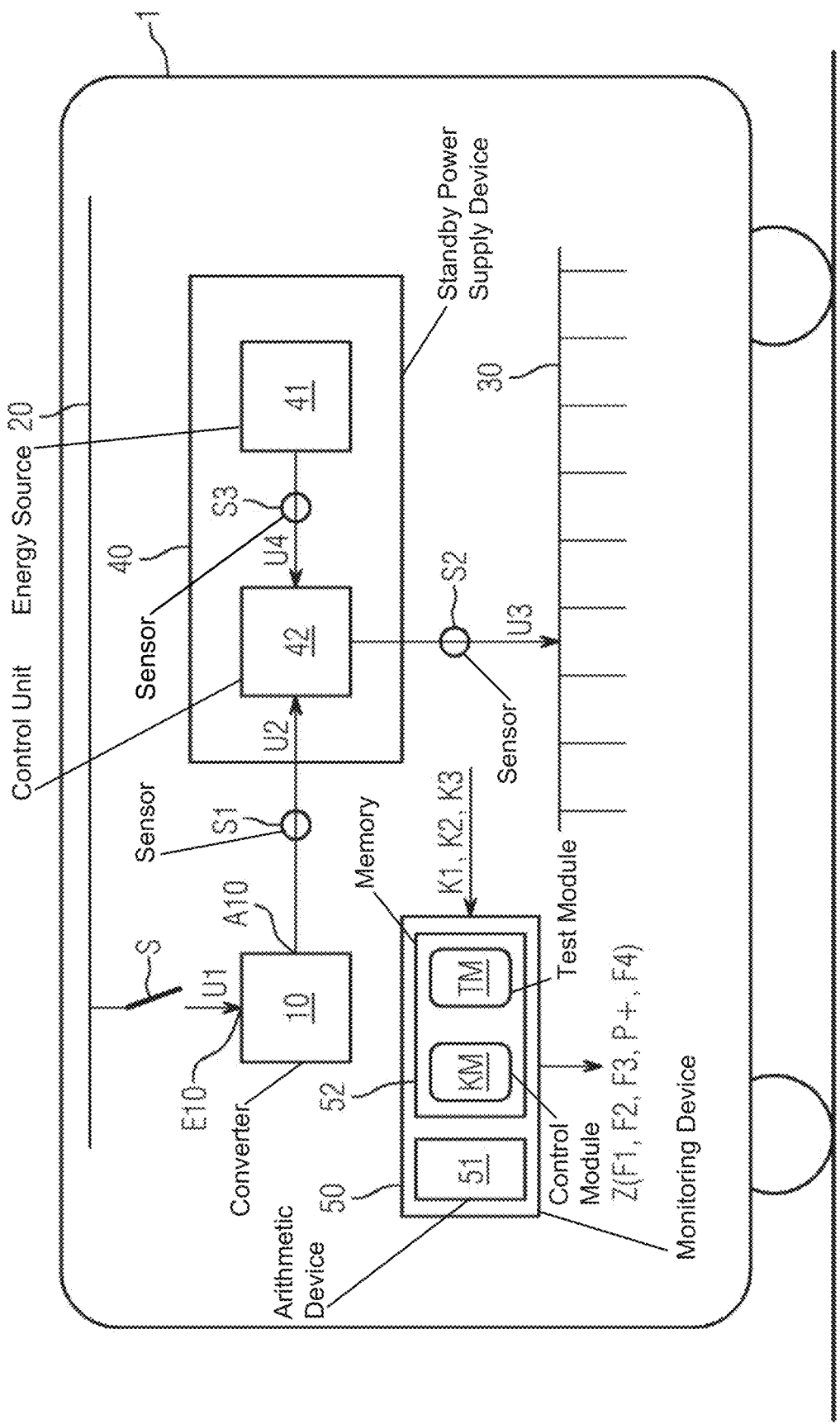
FIG. 2 shows a second exemplary embodiment of an inventive vehicle, in which a monitoring device additionally enables a test operation.

FIG. 2 shows a second exemplary embodiment of a vehicle 1 which is fitted with a converter 10, a vehicle-integrated supply network 20, an internal DC network 30 and a standby power supply device 40. The latter components correspond to the corresponding components 10 to 40, as have already been explained in connection with FIG. 1.

In contrast to the exemplary embodiment in accordance with FIG. 1, an additional test module TM is stored in the memory 52 of the monitoring device 50, and on execution by the arithmetic device 51 enables a test operation of the monitoring device 50. As part of the test operation the test module TM or the monitoring device 50 switches off the input-side supply to the standby power supply device 40, in other words the DC voltage U2 present at the standby power supply device. In the exemplary embodiment in accordance with FIG. 2 the DC voltage U2 is switched off by a switch S which is arranged between the input E10 of the converter 10 and the vehicle-integrated supply network 20. By opening the switch S the supply to the converter 10 can be cut off, such that it can (immediately or at least after dissipation of internal stored electrical charges or magnetic fields) no longer feed DC voltage U2 into the standby power supply device 40. In the event of a failure of the DC voltage U2 of the converter 10 the control unit 42 will alternatively—when working correctly—feed the auxiliary operating voltage U4 of the stored energy source 41 into the internal DC network 30. The control signal K1(U2) will indicate that it is missing at the input-side supply to the standby power supply device 40; the control signal K2 (U3) confirms the further supply to the internal DC network 30, which is now effected by the stored energy source 41 of the standby power supply device 40.

In the further test operation the test module TM will observe the chronological sequence of the control signals K2 and K3. If the stored energy source 41 is working correctly the standby power supply device 40 will be able to maintain the supply to the internal DC network 30 for a predefined minimum period of time, such that the control signals K2 and K3 will continue to display the correct auxiliary operation of the standby power supply device 40 for this minimum period of time. In this case the test module TM can generate a positive test signal P+ as a state signal.

If the standby power supply device 40, in particular the stored energy source 41 thereof, is incorrectly or insufficiently charged, the result will be a drop in the output voltage U3 of the standby power supply device 40 or of the line voltage of the internal DC network 30 prior to the expiry of the predefined minimum period of time; the test module TM of the monitoring device 50 will establish this. In this case it will generate an error signal F4 as a state signal, which indicates the incorrect behavior of the standby power supply device 40, for example caused by a deterioration in the charging capacity of the stored energy source 41 due to ageing.

The test module TM and the control module KM are preferably designed such that the test module TM is executed at regular or irregular intervals autonomously or in response to an external control command.

Figure 3:
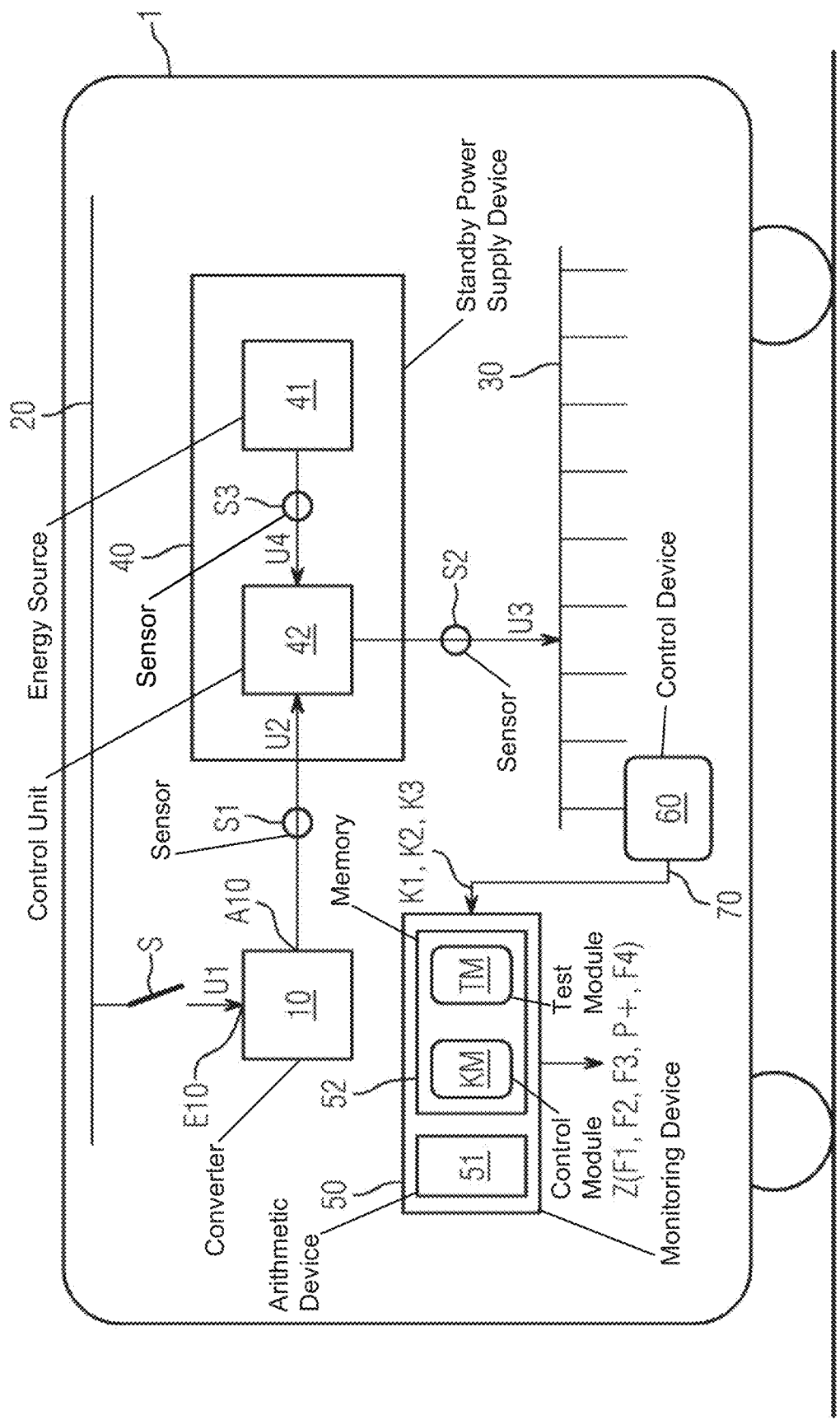
FIG. 3 shows a third exemplary embodiment of an inventive vehicle, in which a control device connected to an internal DC network of the vehicle transmits control signals over a secure connection path to a monitoring device, wherein the control device, the connection path and the monitoring device meet a predefined safety standard.

FIG. 3 shows a third exemplary embodiment of a vehicle 1, in which the components 10, 20, 30 and 40 already described in connection with FIGS. 1 to 2 are present. In contrast to the exemplary embodiments in accordance with FIGS. 1 and 2, a control device 60 is additionally present, which is connected to the internal DC network 30. The control device 60 is connected to the three sensors S1, S2 and S3 via sensor lines not further shown for reasons of clarity and forwards their sensor signals as control signals K1, K2 or K3 directly or in processed form to the monitoring device 50 via a connection path 70 (e.g. in the form of an electrical or optical line, an optical beam connection or a radio connection). The monitoring device 50 is thus not directly connected to the sensors S1, S2 and S3, but is only indirectly connected to them via the control device 60.

The control device 60, the connection path 70 and the monitoring device 50 are preferably designed such that they meet a predefined safety standard, preferably at least SAS1 or SIL1.

Furthermore, the above explanations in connection with FIGS. 1 to 2 apply accordingly for the exemplary embodiment in accordance with FIG. 3.

Figure 4:
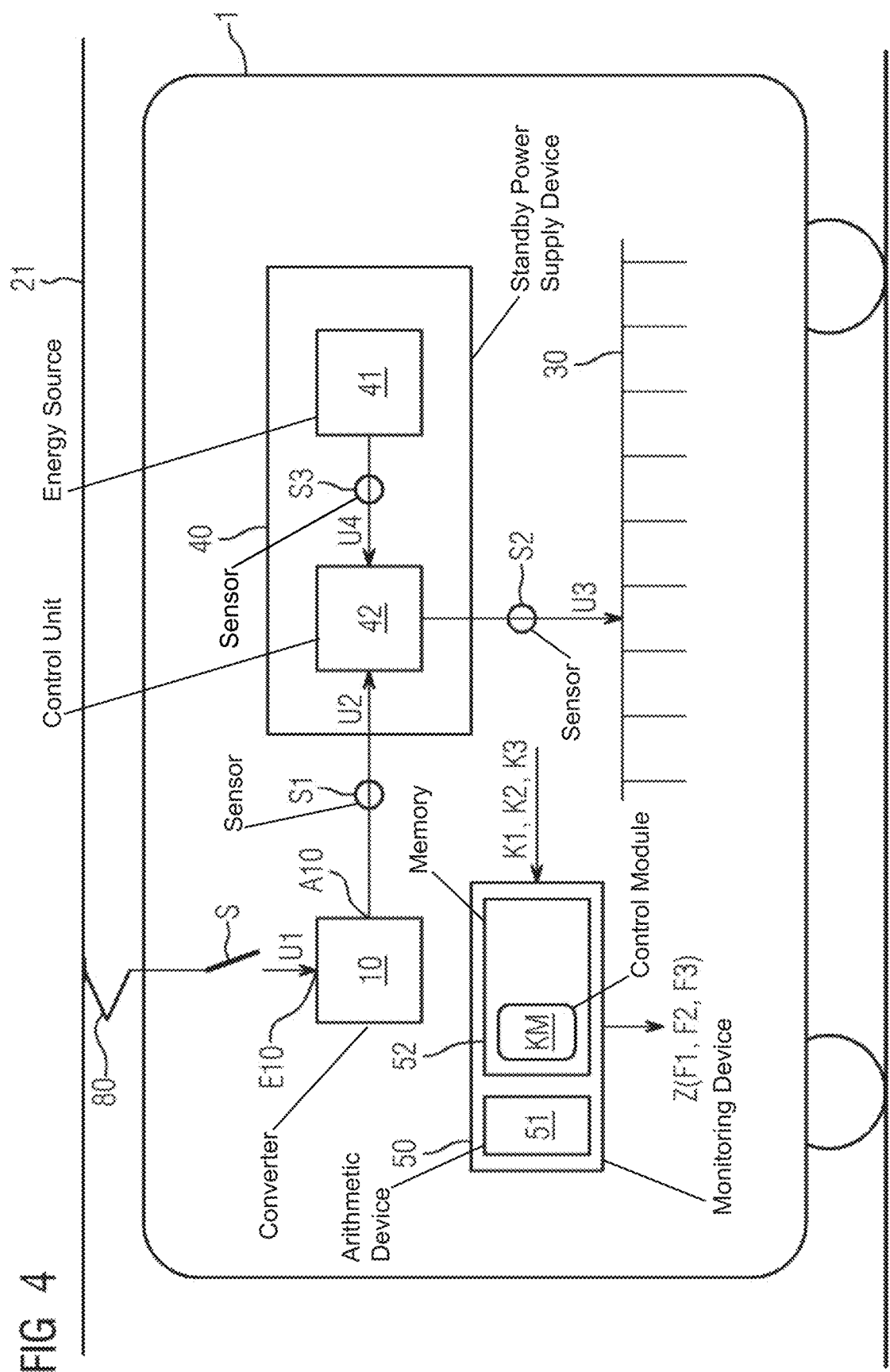
FIGS. 4-6 show exemplary embodiments of inventive vehicles, in which in each case an internal DC network of the vehicle is connected to an external, trackside supply network.

FIG. 4 shows an exemplary embodiment of a vehicle 1, in which the converter 10 is not connected to a vehicle-integrated supply network, but to a vehicle-external, track-side supply network 21, for example via a pantograph 80. In the embodiment in accordance with FIG. 4, the converter 10 and the standby power supply device 40 serve to feed the DC voltage U1 output on the output side by the supply network 21 in a converted form into the internal DC network 30, as was explained in connection with FIG. 1. The above explanations apply correspondingly in this respect, including as regards the functioning of the monitoring device 50.

Figure 5:
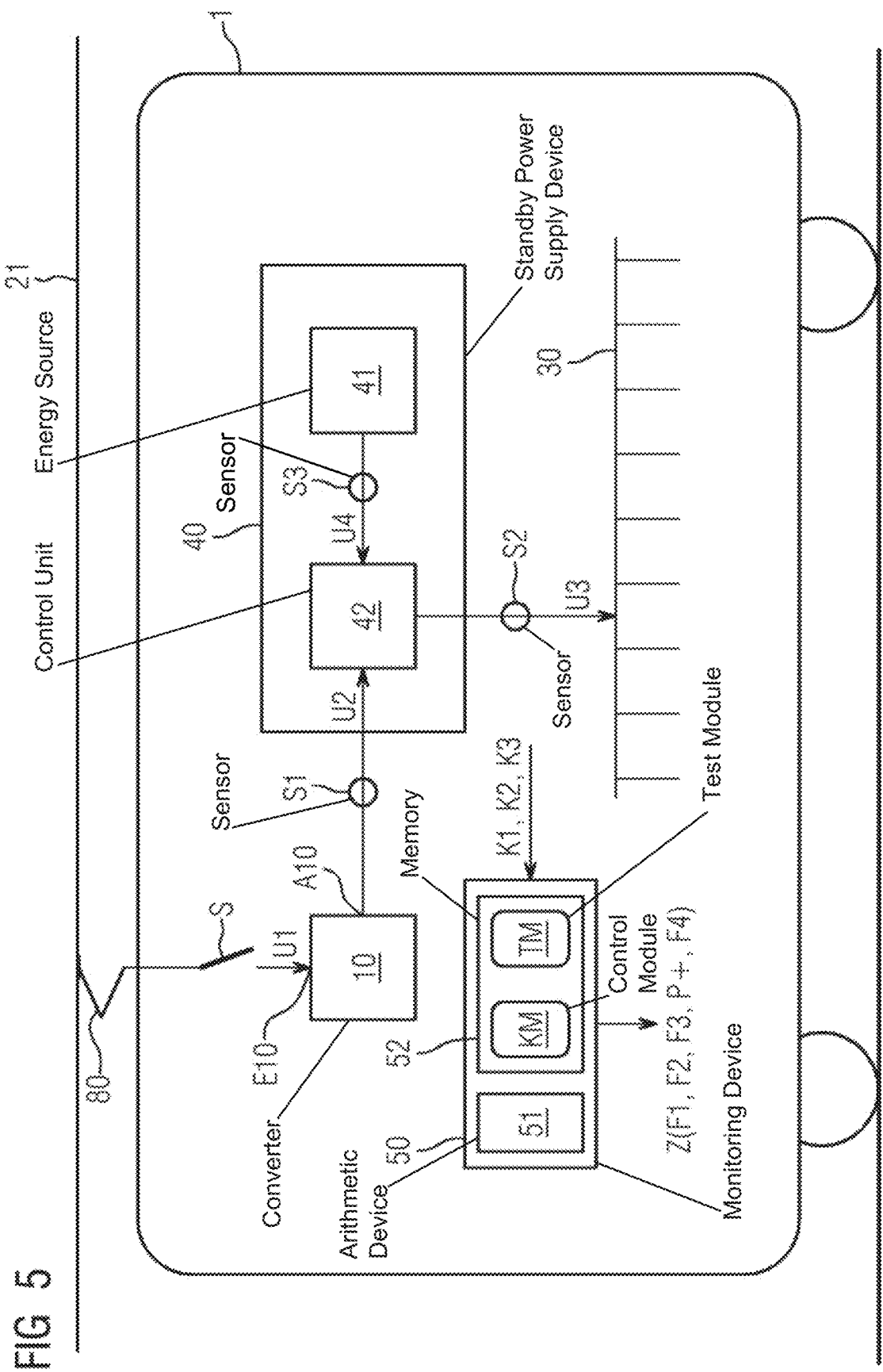

FIG. 5 shows an exemplary embodiment of a vehicle 1, in which the converter 10, as shown in FIG. 4, is connected to a vehicle-external supply network 21. The electrical assembly formed from the converter 10, the internal DC network 30 and the monitoring device 50 corresponds to the electrical assembly as was explained in connection with FIG. 2. In this respect and in respect of the test operation enabled by the test module TM, reference can be made to the above explanations in connection with FIG. 2.

Figure 6:
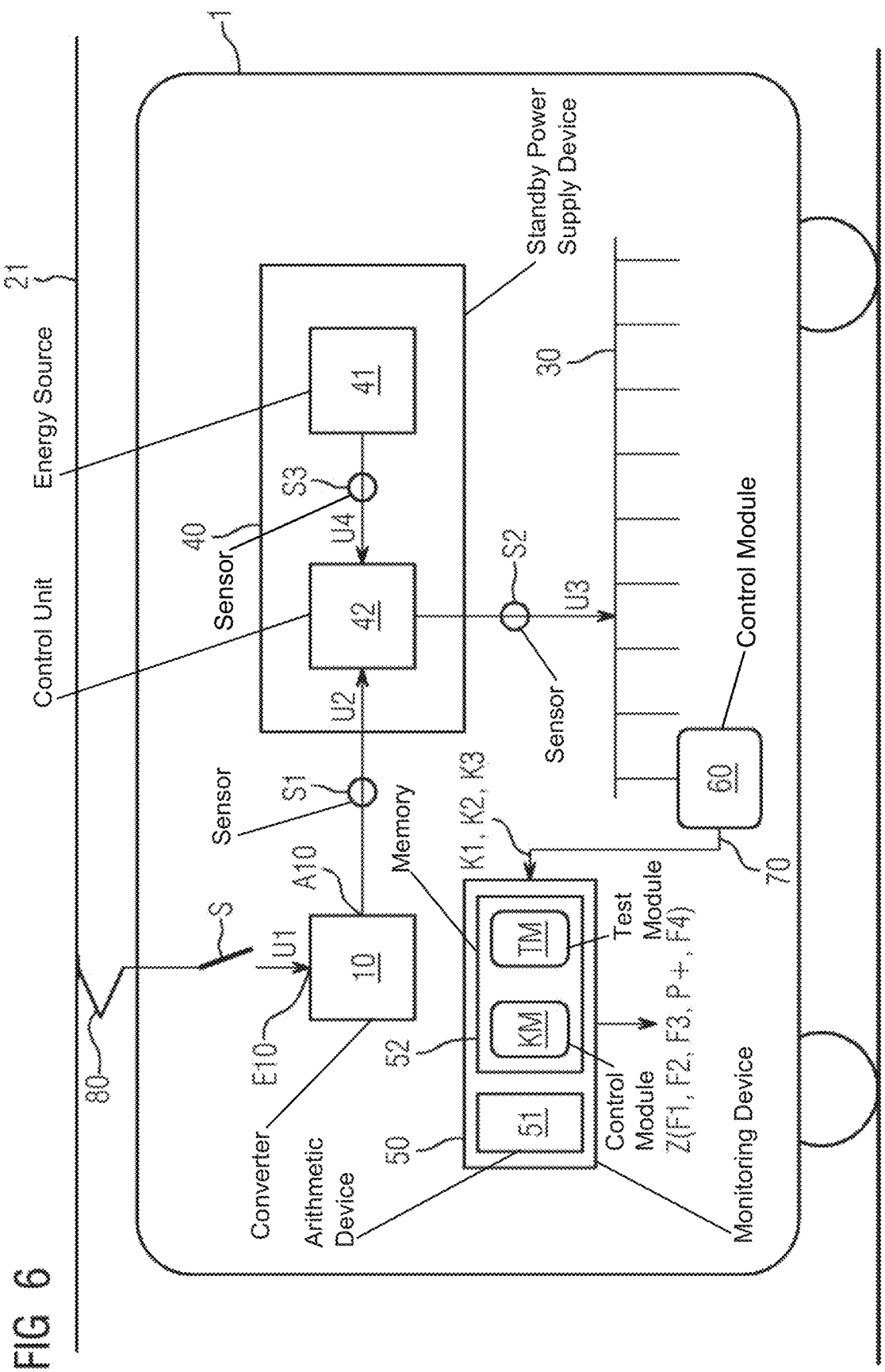

FIG. 6 shows an embodiment variant of the exemplary embodiment in accordance with FIG. 5, in which—as explained in connection with FIG. 3—a control device 60 and a connection path 70 enable a reliable transmission of control signals K1, K2 and K3 to the monitoring device 50;

in this respect reference can be made to the above explanations in connection with FIG. 3, which apply here accordingly.

Although the invention has been illustrated and described in greater detail by preferred exemplary embodiments, the invention is not restricted by the disclosed examples and other variations can be derived herefrom by the person skilled in the art, without departing from the scope of protection of the invention.

LIST OF REFERENCE CHARACTERS

1 Vehicle
10 Converter
20 Vehicle-integrated supply network
21 Vehicle-external supply network
30 Internal DC network
40 Standby power supply device
41 Stored energy source
42 Control unit
50 Monitoring device
51 Arithmetic device
52 Memory
60 Control device
70 Connection path
80 Pantograph
A10 Output
E10 Connection
F1 Error signal
F2 Error signal
F3 Error signal
F4 Error signal
K1 Control signal
K2 Control signal
K3 Control signal
KM Control module
P+ Positive test signal
S Switch
51 Sensor
52 Sensor
53 Sensor
TM Test module
U1 DC voltage
U2 DC voltage
U3 Output voltage
U4 Auxiliary operating voltage
Z State signal

The invention claimed is:

1. A vehicle, comprising:
a converter having a connection on an input side for a vehicle-integrated or vehicle-external supply network and being configured to generate a DC voltage on an output side;
an internal DC network to be operated using the DC voltage of said converter;
a standby power supply device connected between said converter and said internal DC network, said standby power supply device receiving an input voltage formed directly or indirectly from the DC voltage of said converter, and an energy storage device for outputting an auxiliary operating voltage;
said standby power supply device being configured for feeding the input voltage, or alternatively the auxiliary operating voltage supplied by said energy storage device, into said internal DC network as an output voltage; and a monitoring device configured:
to process at least three control signals, namely, a first control signal which describes the DC voltage output by said converter, a second control signal which describes the output voltage fed by said standby power supply device into said internal DC network, and a third control signal which describes a state of charge of the energy storage device and forms a state of charge signal; and
to generate, as a function of the three control signals, at least one state signal which specifies a state of an electrical assembly formed of said converter and said standby power supply device.

2. The vehicle according to claim 1, wherein said monitoring device is further configured to generate an error signal indicating an error in a control unit of said standby power supply device if the first control signal lies within a tolerance range predefined for the first control signal and the second control signal lies outside a tolerance range predefined for the second control signal.

3. The vehicle according to claim 1, wherein said monitoring device is further configured to generate a state signal being an error signal indicating an error in said energy storage device of said standby power supply device if the third control signal lies outside a tolerance range predefined for the third control signal.

4. The vehicle according to claim 1, wherein said monitoring device is further configured to generate a state signal being an error signal indicating an error in said converter or in said supply network if the first control signal lies outside a tolerance range predefined for the first control signal.

5. The vehicle according to claim 1, wherein said monitoring device is further configured to carry out a test operation, wherein said monitoring device switches off an input-side supply to said standby power supply device and subsequently evaluates a chronological sequence of the three control signals.

6. The vehicle according to claim 5, wherein said monitoring device, during the test operation, switches off the input voltage present at said standby power supply device by switching off said converter or by switching off a power supply from the vehicle-external supply network to said converter.

7. The vehicle according to claim 5, wherein said monitoring device is further configured to generate a state signal being a test signal indicating a correct state of said standby power supply device if the second and third control signal remain within their tolerance ranges for a predefined minimum period of time after the input-side supply to said standby power supply device has been switched off.

8. The vehicle according to claim 5, wherein said monitoring device is further configured to carry out the test operation autonomously at regular or irregular intervals.

9. The vehicle according to claim 5, wherein said monitoring device is further configured to carry out the test operation in response to an external control command.

10. The vehicle according to claim 1, wherein:
the supply network is a DC voltage network; and
said converter is a DC/DC converter supplied by the DC voltage network.

11. The vehicle according to claim 10, wherein the supply network is an on-board DC voltage network of the vehicle.

12. The vehicle according to claim 1, which comprises a control device connected to the internal DC network fed by said standby power supply device, and wherein said control device is configured to receive the three control signals and to forward the three control signals to said monitoring device in processed or unprocessed form.

13. The vehicle according to claim 12, wherein said control device, said monitoring device, and a connection path between said control device and said monitoring device meet a predefined safety standard.

14. The vehicle according to claim 13, wherein the predefined safety standard is SAS1/SIL1 or a better safety standard.

15. A method of operating an electrical assembly of a vehicle, the method comprising:
   connecting an input of a converter to a vehicle-integrated or vehicle-external supply network and generating a DC voltage on an output side of the converter;
   operating an internal DC network with the DC voltage of the converter;
   connecting a standby power supply device between the converter and the internal DC network;
   forming an input voltage of the standby power supply device directly or indirectly by the DC voltage of the converter and feeding the input voltage of the standby power supply device, or alternatively an auxiliary operating voltage supplied by an energy storage device of the standby power supply device as an output voltage from the standby power supply device into the internal DC network; and
   processing at least three control signals by a monitoring device, the at least three control signals including a first control signal which describes the DC voltage output by the converter, a second control signal which describes the output voltage fed by the standby power supply device into the internal DC network, and a third control signal which describes a state of charge of the energy storage device and forms a state of charge signal, and generating a state signal by the monitoring device as a function of the at least three control signals, the state signal describing a state of an assembly with the converter and the standby power supply device.

16. The method according to claim 15, which comprises:
   generating an error signal indicating an error in a control unit of the standby power supply device if the first control signal lies within a tolerance range predefined for the first control signal and the second control signal lies outside a tolerance range predefined for the second control signal; and/or
   generating, as a state signal, an error signal indicating an error in the energy storage device of the standby power supply device if the third control signal lies outside a tolerance range predefined for the third control signal; and/or
   generating, as a state signal, an error signal indicating an error in the converter or the supply network if the first control signal lies outside a tolerance range predefined for the first control signal.

17. The method according to claim 15, which further comprises carrying out a test operation by switching off an input-side supply to the standby power supply device and subsequently evaluating a chronological sequence of the three control signals.

18. The method according to claim 17, which further comprises switching off the input voltage present at the standby power supply device by switching off the converter or by switching off the external supply to the converter from the supply network and subsequently evaluating the chronological sequence of the three control signals.

* * * * *